US 7,729,157 B2
United States Patent
Hoya (10) Patent No.: US 7,729,157 B2
(45) Date of Patent: Jun. 1, 2010

(54) SEMICONDUCTOR STORAGE DEVICE (75) Inventor: Katsuhiko Hoya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 12/201,328

(22) Filed: Aug. 29, 2008

(65) Prior Publication Data
US 2009/0059647 A1 Mar. 5, 2009

(30) Foreign Application Priority Data
Aug. 30, 2007 (JP) ............................. 2007-223976

(51) Int. Cl.
G11C 11/12 (2006.01)
G11C 11/24 (2006.01)
G11C 29/00 (2006.01)
G11C 7/00 (2006.01)
(52) U.S. Cl. ........................................ 365/145; 714/48
(58) Field of Classification Search .................. 365/145; 714/48
See application file for complete search history.

(56) References Cited

U.S. PATENT DOCUMENTS 6,477,096 B1 * 11/2002 Inoue .......................... 365/201
6,822,890 B2 11/2004 Torjussen et al.
7,123,501 B2 * 10/2006 Noda .......................... 365/145

FOREIGN PATENT DOCUMENTS

| JP | 2005-135488 | 5/2005 |
| JP | 2006-228291 | 8/2006 |
| JP | 2007-080343 | 3/2007 |

* cited by examiner

Primary Examiner—Mark A. Robinson
Assistant Examiner—James G Norman
(74) Attorney, Agent, or Firm—Oblon, Spivak, McClelland, Maier & Neustadt, L.L.P.

(57) ABSTRACT

A memory cell array has memory cells, each of which has a ferroelectric capacitor and a selection transistor. A plate line is connected to one end of the ferroelectric capacitor and applied a certain plate line voltage. A sense amplifier circuit senses and amplifies voltage of the bit line. An error correction circuit corrects any error in retained data in the memory cells sensed by the sense amplifier. A plate line control circuit controls the timing for switching a potential of the plate line to a ground potential, based on absence or presence of error correction by the error correction circuit.

17 Claims, 11 Drawing Sheets

SEMICONDUCTOR STORAGE DEVICE

CROSS REFERENCE TO RELATED APPLICATIONS

This application is based on and claims the benefit of priority from prior Japanese Patent Application No. 2007-223976, filed on Aug. 30, 2007, the entire contents of which are incorporated herein by reference.

BACKGROUND OF THE INVENTION

1. Field of the Invention

The present invention relates to a semiconductor storage device, and in particular, to a semiconductor storage device with an error correction function.

2. Description of the Related Art

Ferroelectric memories (FeRAMs) are semiconductor storage devices that allow non-volatile storage of data based on two different magnitudes of polarization in a ferroelectric substance, using hysteresis characteristics of ferroelectric capacitors.

Generally, conventional ferroelectric memories have memory cells that employ architecture similar to that used in DRAM, wherein paraelectric capacitors are replaced with ferroelectric capacitors and the ferroelectric capacitors are connected to selection transistors in series (see, for example, Japanese Patent Laid-Open No. 2001-250376). Such memory cells are arranged in a grid pattern to constitute a memory cell array. When reading data, for example, a word line (selection line) corresponding to one of the memory cells to be read is driven in such a way that the corresponding selection transistor becomes conductive, by which the memory cell is connected to the corresponding bit line.

In addition, a so-called TC parallel unit serial connection type ferroelectric memory is known that is provided with memory cell blocks having memory cells connected in series, each of which memory cells is configured by parallel connection of a selection transistor and a ferroelectric memory (see, for example, Japanese Patent Laid-Open No. 2005-4811). For the TC parallel unit serial connection type ferroelectric memory, each of the memory cell blocks may be connected to a respective bit line when a block selection transistor with a block selection line (selection line) connected to its gate becomes conductive.

Whether a structure similar to that used in DRAM or a structure of TC parallel unit serial connection type, the ferroelectric memories may use the following schemes: "two transistors-two cells" (2T2C) scheme that uses two memory cells to read complementary data, and "one transistor-one cell" (1T1C) scheme that uses one memory cell to read complementary data.

By way of example, provided that a structure similar to DRAM is used, in the 2T2C scheme, a word line corresponding to one of the memory cells to be read and another word line corresponding to the complementary memory cell in which the complementary data is retained are selected to connect the memory cell to the bit line and the complementary memory cell to a complementary bit line. Then, plate voltage is applied to a plate line and voltage is applied across ferroelectric capacitors that configure the memory cell and the complementary memory cell, respectively. Charges from one ferroelectric capacitor in the memory cell are read to the bit line, while those from the other ferroelectric capacitor in the complementary memory cell are read to the complementary bit line. Then, the potentials of the pair of bit lines are compared and amplified by a sense amplifier.

On the other hand, in the 1T1C scheme, a word line connected to one of the memory cells to be read is selected to connect the memory cell to a corresponding bit line. Thereafter, plate voltage is applied to a plate line connected to the memory cell and voltage is applied across a ferroelectric capacitor that configures the memory cell. As a result, while charges from the ferroelectric capacitor are read to the bit line, a reference potential is applied to complementary bit lines, which constitute a pair of bit lines, by a reference potential generation circuit. The potentials of the pair of bit lines are compared and amplified by a sense amplifier. For the TC parallel unit serial connection type, it has a similar configuration to the other two schemes, except that a memory cell block is selected by a block selection transistor and a memory cell is selected by a word line.

The read operation of ferroelectric memory is destructive read because data is read by applying voltage across a ferroelectric capacitor to cause polarization inversion. Accordingly, after a read operation, it is necessary to write the read data back to the corresponding memory cell. In the conventional ferroelectric memories, for example, write back of "0" data may be performed by maintaining potentials of a pair of bit lines amplified by a sense amplifier circuit, and then write back of "1" data may be performed by reducing the potential of the plate line to a ground potential while maintaining the amplified potentials of the pair of bit lines.

Meanwhile, the ferroelectric memories may also be provided with error correction circuits (ECC circuits) for correcting data errors in a memory cell (see, for example, Japanese Patent Laid-Open No. 2002-175697). When ECC circuits are provided and error detection and correction is executed, it is necessary to maintain potentials of plate lines and bit lines during execution. Consequently, it will take longer to write "0" data than to write "1" data, causing so-called "imprint" (providing shifts in hysteresis characteristics of a corresponding ferroelectric capacitor), which could lead to degraded data reliability.

SUMMARY OF THE INVENTION

One aspect of the present invention provides a semiconductor storage device comprising: a memory cell array having memory cells arranged therein, each of the memory cells having a ferroelectric capacitor and a selection transistor; a plate line applying a certain plate line voltage to one end of the ferroelectric capacitor; a bit line connected to one end of the selection transistor; a sense amplifier circuit sensing and amplifying voltage of the bit line; an error correction circuit correcting any error in retained data in the memory cells sensed by the sense amplifier; and a plate line control circuit controlling the timing for switching a potential of the plate line to a ground potential, based on absence or presence of error correction by the error correction circuit.

DETAILED DESCRIPTION OF THE EMBODIMENTS

Embodiments of the present invention will now be described in detail below with reference to the accompanying drawings.

[Basic Principles]

Firstly, basic principles of a ferroelectric memory according to embodiments of the present invention will be described below.

Figure 1:
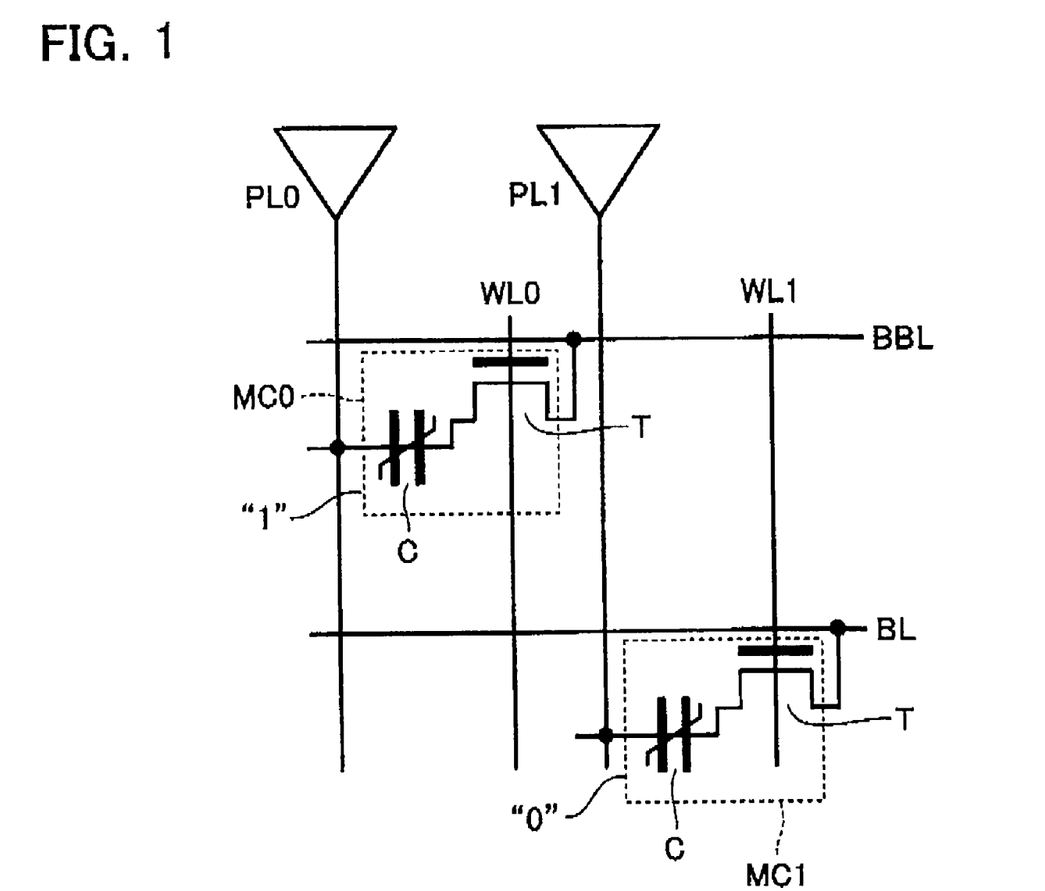
FIG. 1 is a diagram illustrating basic principles of a ferroelectric memory according to embodiments of the present invention.

As illustrated in FIG. 1, in this ferroelectric memory, memory cells MC0 and MC1 have ferroelectric capacitors C and selection transistors T connected in series, and they are connected to a pair of bit lines BL and BBL, respectively. One end of each selection transistor T is connected to a respective bit line BL and BBL and one end of each ferroelectric capacitor C connected to a respective plate line PL0 and PL1. A plate line voltage is applied to the plate lines PL0 and PL1 when reading data from and writing data to the memory cells MC0 and MC1. The bit lines BL and BBL are connected to a sense amplifier (not illustrated) to sense and amplify respective potentials.

In addition, the gates of the selection transistors T are connected to word lines WL0 and WL1. The word lines WL0 and WL1 are provided with a selection signal in synchrony with the plate line voltage applied to the plate lines PL0 and PL1.

As an example, in this embodiment, it is assumed that complementary data is stored in the memory cells MC0 and MC1. For example, if data "0" is stored in the former memory cell, then data "1" is stored in the latter memory cell. Conversely, if data "1" is stored in the former memory cell, then data "0" is stored in the latter memory cell. That is, a so-called 2T2C scheme is performed that stores one piece of data using two memory cells MC.

Then, the ferroelectric memory of this embodiment comprises an error correction circuit, not illustrated in FIG. 1, which performs operations to detect an error, output corrected data, and further rewrite the corrected data to a memory cell.

Figure 2:
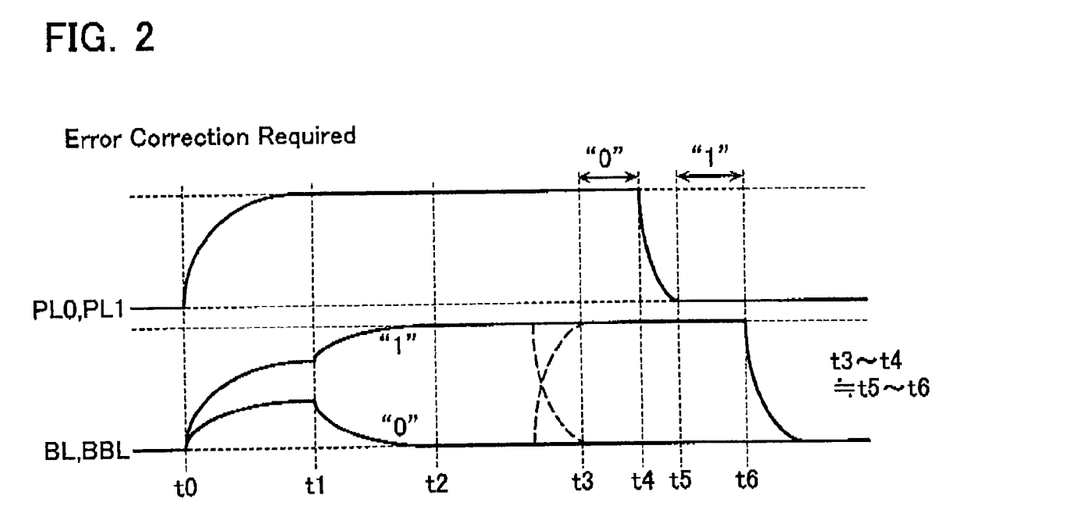
FIG. 2 is a timing chart illustrating the operation related to the basic principles of a ferroelectric memory according to the embodiments of the present invention.
Figure 3:
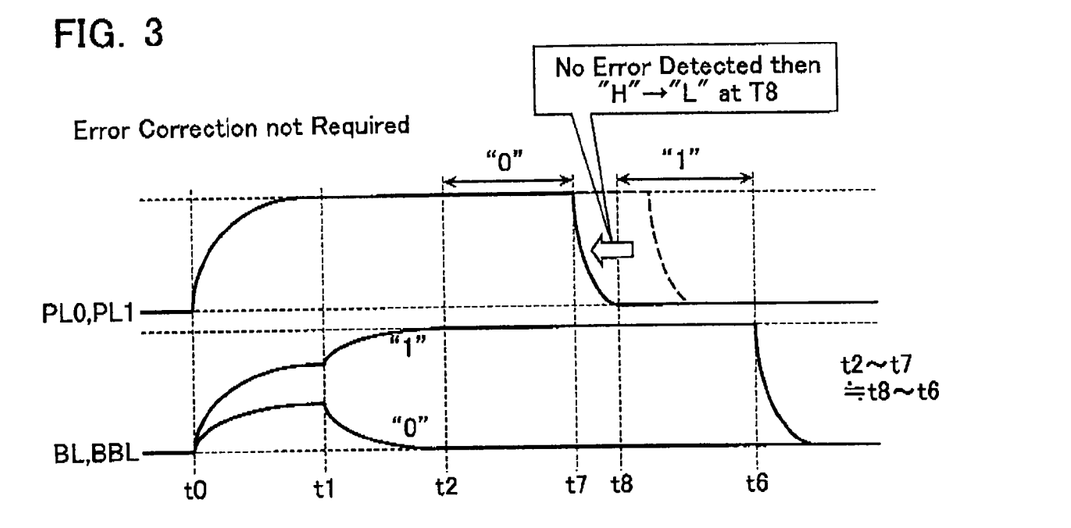
FIG. 3 is a timing chart illustrating the operation related to the basic principles of a ferroelectric memory according to the embodiments of the present invention.

The reading operation of the ferroelectric memory of this embodiment is performed as illustrated in FIGS. 2 and 3. FIG. 2 is a timing chart illustrating the operation when an error is detected by the error correction circuit, and FIG. 3 is a timing chart illustrating the operation when no error is detected by the error correction circuit.

[Operation when an Error Detected]

Firstly, the operation when an error is detected will be described in detail with reference to FIG. 2. Initially, at time t0, when the plate lines PL0 and PL1 rise from "L" to "H" while at the same time the word lines WL0 and WL1 rise from "L" to "H", potentials are produced at the bit lines BL and BBL, respectively, depending on the data written to the memory cells MC0 and MC1. Since the ferroelectric memory involves destructive read, data in one of the memory cells MC0 and MC1 is destroyed at this moment.

A sense amplifier (not illustrated in FIG. 1) is activated, e.g., at time t2, to sense and amplify any change in potentials of the bit lines BL and BBL. Then, the potentials of the bit lines BL and BBL change to "H" or "L" depending on data in the memory cells MC0 and MC1. As complementary data is retained in the memory cells MC0 and MC1 (2T2C scheme), if one of the bit lines BL and BBL has a potential of "H", then the other has a potential of "L".

An error correction circuit (not illustrated in FIG. 1) detects and corrects an error in the read data based on parity data and outputs the corrected data to the outside.

If an error is detected and corrected by the error correction circuit, then the corrected data is rewritten to one of the memory cells from which the data is read. That is, as indicated by the dotted line at time t3 of FIG. 2, the potentials of the bit lines BL and BBL are inverted with respect to those before correcting the error. Upon inversion of the potentials, data is rewritten between times t3 and t4 to one of the memory cells MC0 and MC1 in which the retained data changed to "0" after correcting the error. Through this rewriting of data, "0" is rewritten to the memory cell to which data "1" has been incorrectly written.

In turn, at time t5, when the potentials of the plate lines PL0 and PL1 switch from "H" to "L" while at the same time a write-enable signal WE falls that instructs a write operation, data is rewritten between times t5 and t6 to the other of the memory cells MC0 and MC1 in which the retained data changed to "1". Through this rewriting of data, data "1" is rewritten to the memory cell to which data "0" has been incorrectly written.

[Operation when No Error Detected]

Alternatively, as illustrated in FIG. 3, if the error detection performed by the error correction circuit indicates that no error is detected, the potentials of the plate lines PL and /PL are caused to fall from "H" to "L" at time t8 preceding time t5 (FIG. 2).

Unlike in FIG. 2, since no operation is performed here to inverse the potentials of the bit lines BL and BBL (as indicated by the dotted line of FIG. 2) based on the results of error correction, rewriting data "0" to one of the memory cells in which data "0" is stored is performed between times t2 and t7. On the other hand, rewriting data "1" to one of the memory cells in which data "1" is stored is performed between times t8 and t6. The timing of time t4 is adjusted so that the length of time between times t2 and t7 becomes substantially the same as that between times t8 and t6.

Figure 4:
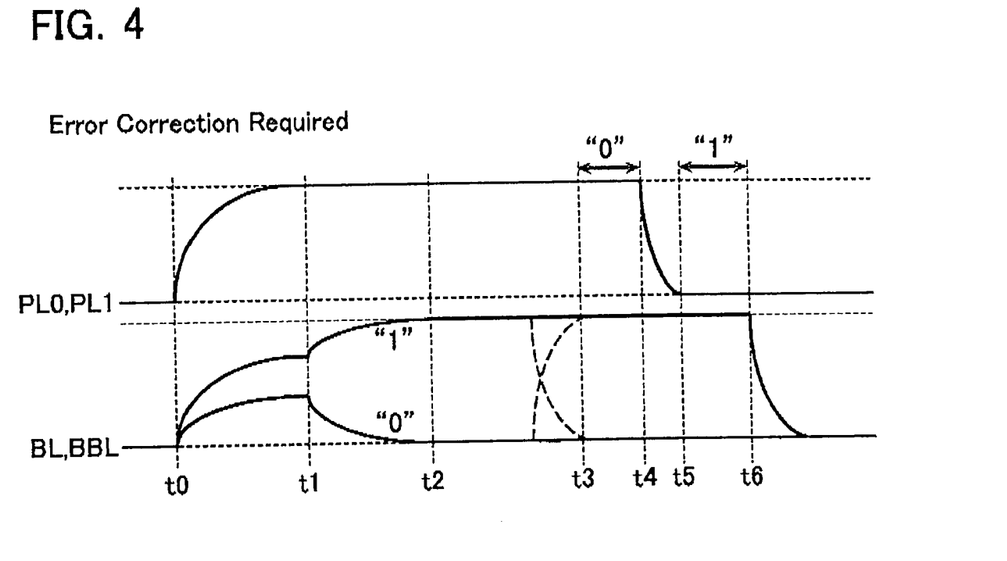
FIG. 4 is a timing chart illustrating the operation in a comparative example to the embodiments of the present invention.
Figure 5:
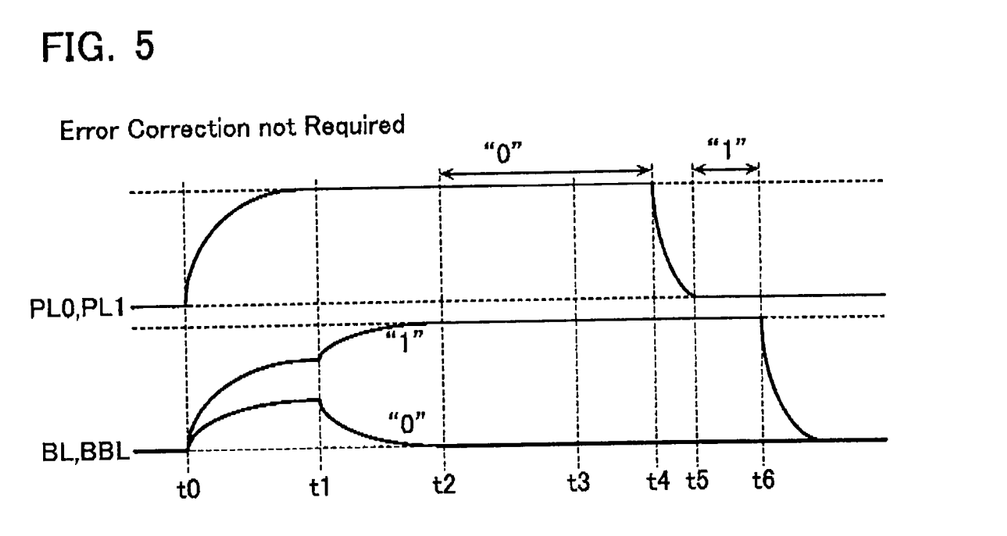
FIG. 5 is a timing chart illustrating the operation in another comparative example to the embodiments of the present invention.

On the contrary, FIG. 4 and FIG. 5 illustrate the operation of another ferroelectric memory (in comparative examples) where the timing when the plate lines PL0 and PL1 fall is fixed to time t5, irrespective of absence or presence of error correction. FIG. 4 illustrates a case where an error is detected and error correction is performed on it (as in FIG. 2), while FIG. 5 illustrates another case where an error is not detected and error correction is not performed. The timing when voltage of the plate line PL falls is the same in both the comparative examples.

In the comparative examples, when error correction is performed (FIG. 4), the length of operation time for rewriting data "0" (from time t3 to t4) is substantially the same as that for rewriting data "1" (times t5 to t6). However, when an error is not detected and error correction is not performed (FIG. 5), the length of operation time for rewriting data "0" (from time t2 to t4) becomes longer than that for rewriting data "1" (from time t5 to t6). Such imbalance between the rewriting operations may degrade the reliability of retained data in the memory cells due to so-called "imprint".

On the contrary, according to this embodiment, since the timing when the potentials of the plate lines PL and /PL fall is controlled based on absence or presence of error correction, the length of operation time for rewriting data "0" may be substantially the same as that for rewriting data "1", irrespective of absence or presence of error detection and correction. Therefore, any imprint may be prevented to improve the reliability of retained data in the memory cells.

First Embodiment

Figure 6:
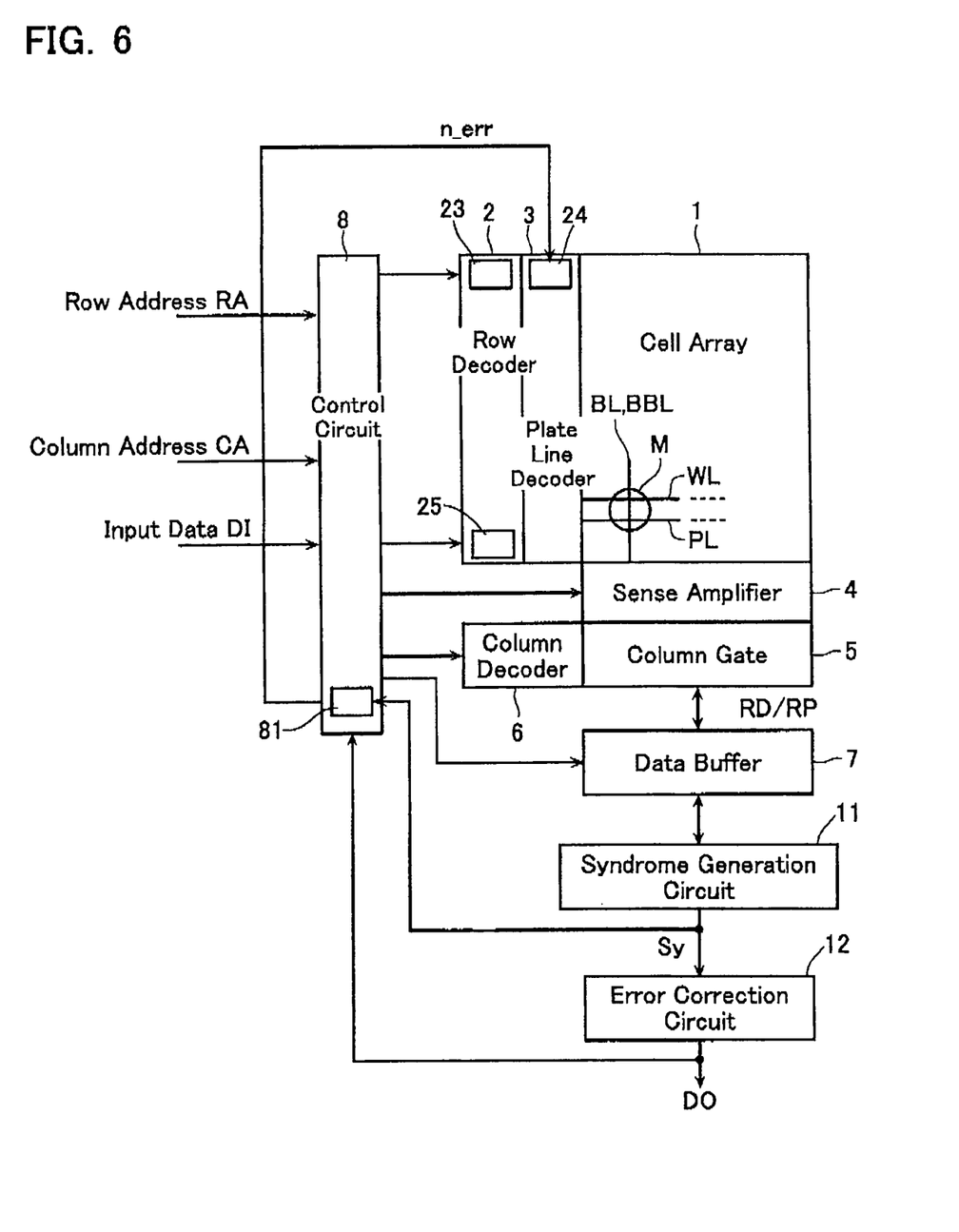
FIG. 6 is a circuit diagram illustrating an entire configuration of a ferroelectric memory according to a first embodiment of the present invention.

FIG. 6 illustrates a block configuration of a ferroelectric memory according to a first embodiment.

A memory cell array 1 is configured to have memory cells M arranged therein, each of which includes a ferroelectric capacitors C and a selection transistor T connected in series. Each of the memory cells M is arranged at a respective cross point of a word line WL, a plate line PL, and a bit line BL or BBL. A word line WL is selectively driven by a row decoder 2 and a plate line PL is selectively driven by a plate line decoder 3 in the memory cell array 1.

A sense amplifier 4 is provided to sense and amplify signals read from each of the memory cells M to the bit lines BL and BBL. A column gate 5 has a function for selectively connecting one of the columns for reading to a data line DQ or BDQ, selection of which is performed by a column decoder 6. A data buffer 7 has a function for temporarily retaining read data RD and parity data RP. A control circuit 8 is also provided as a circuit for controlling these circuits.

A syndrome generation circuit 11 produces a syndrome Sy indicating an error position, etc., based on the read data RD and the parity data RP. The syndrome Sy is output to an error correction circuit 12, but also to the control circuit 8 for the above-mentioned operations in FIGS. 1 through 3. The error correction circuit 12 corrects the read data RD based on the syndrome Sy to output the error-corrected data DO via an I/O circuit (not illustrated). The error-corrected data DO is also output to the control circuit 8 for the above-mentioned operations in FIGS. 1 through 3. The control circuit 8 transfers the data DO to the data buffer 7, which data is in turn provided via a column gate 7 to the sense amplifier 4. As a result, the rewriting operation is performed as previously described (inverting the potentials of the bit lines BL and BBL with respect to those before detecting the error) to correct error data in the corresponding memory cell.

Figure 7:
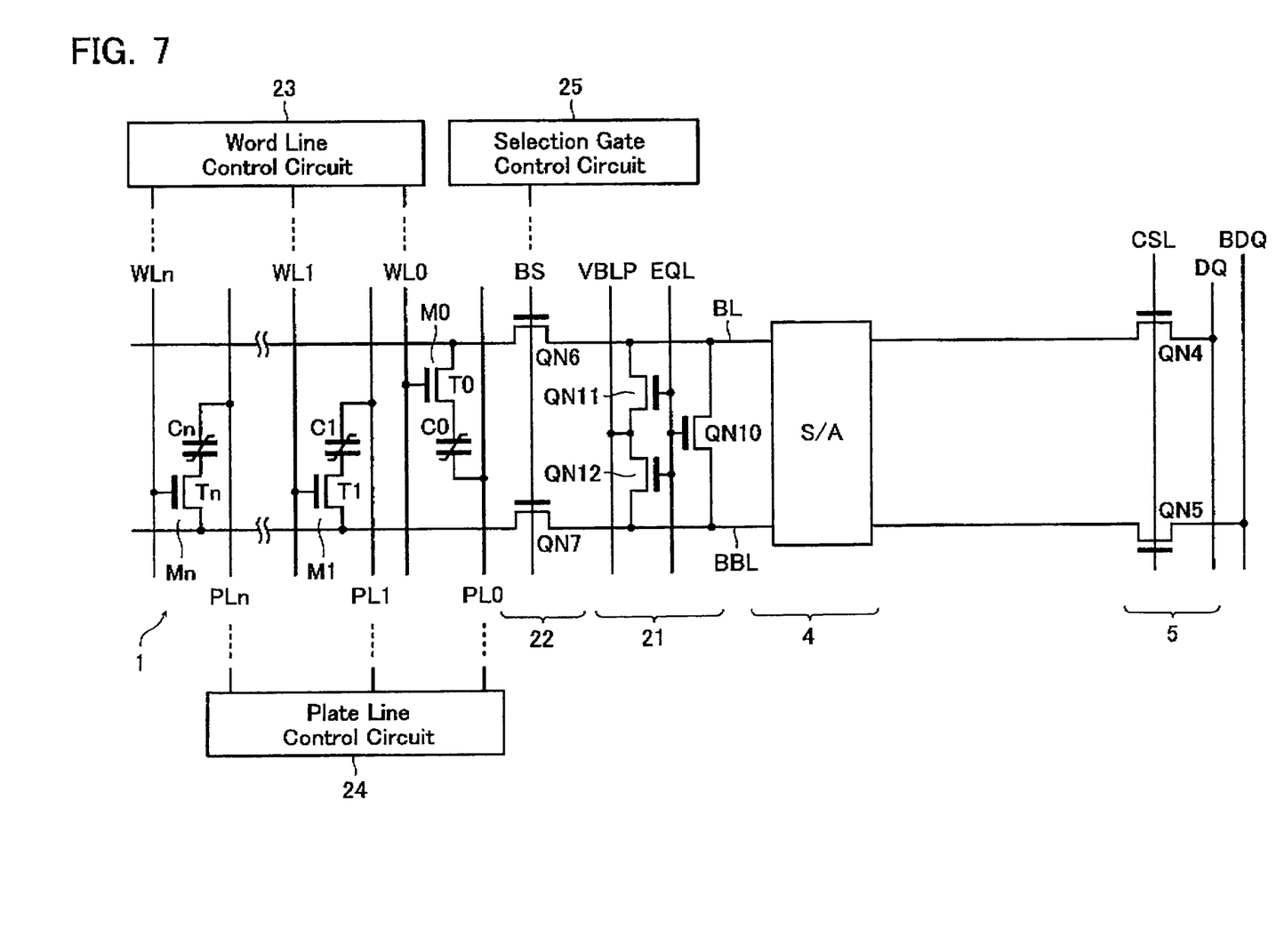
FIG. 7 is a circuit diagram illustrating a configuration of the memory cell array 1 of the first embodiment.

The memory cell array 1 is configured as illustrated in FIG. 7, focusing on a pair of complementary bit lines BL and BBL. In this case, an example of one transistor/one capacitor configuration is illustrated where a memory cell Mi (i=0 to n) includes one selection transistor Ti and one ferroelectric capacitor Ci. A selection transistor Ti has its one end connected to the bit line BL or BBL and its gate connected to a word line WLi. A ferroelectric capacitor Ci has its terminal (plate electrode) connected to a plate line PLi.

A word line control circuit 23 to drive a word line WLi is included in the row decoder 2. A plate line control circuit 24 to drive a plate line PLi is included in the plate line decoder 3. The bit lines BL and BBL are separated between the internal region of the cell array and the sense amplifier 4 region by NMOS transistors QN6 and QN7 in a selection gate 22. The selection gate 22 is on/off controlled by selection signals from a selection gate control circuit 25 included in the row decoder 2.

A bit line equalization circuit 21 and a sense amplifier 4 are provided on the bit lines BL and BBL external to the selection gate 22.

The equalization circuit 21 has an NMOS transistor QN10 for equalization, which provides a short circuit between the bit lines BL and BBL, and NMOS transistors QN11 and QN12 for precharging, each of which has its one end connected to each of the bit lines BL and BBL. The gates of these transistors are commonly controlled by equalization signals EQL.

In addition, the bit lines BL and BBL are connected to the data lines DQ and BDQ, respectively, via NMOS transistors QN4 and QN5 that configure the column gate 5. The column gate 5 is controlled by the column decoder 6.

The read data is output to an I/O terminal via the data buffer 7 illustrated in FIG. 1. In addition, the written data input from the I/O terminal is transferred via the data buffer 7 to the sense amplifier 4 that is connected to one of the columns selected by the column gate 5. In this way, data is written to the selected memory cell in the memory cell array 1. This is true for subsequent data after the error correction as described above.

The control circuit 8 controls writing to and reading from the memory cell array 1. The control circuit 8, for example, captures row addresses from the outside to control the row decoder 2 and the plate line decoder 3. The control circuit 8 also captures column addresses from the outside to control the column decoder 6. Then, the control circuit 8 captures input data DI from the outside, transfers it to the data buffer 7, and causes it to write the input data DI. The input data DI may include effective data as well as parity data as an error correction code. Further, the control circuit 8 generates a bit-line equalization signal EQL, sense-amplifier activation signals SAP, BSAN, and so on at certain timing.

Figure 8:
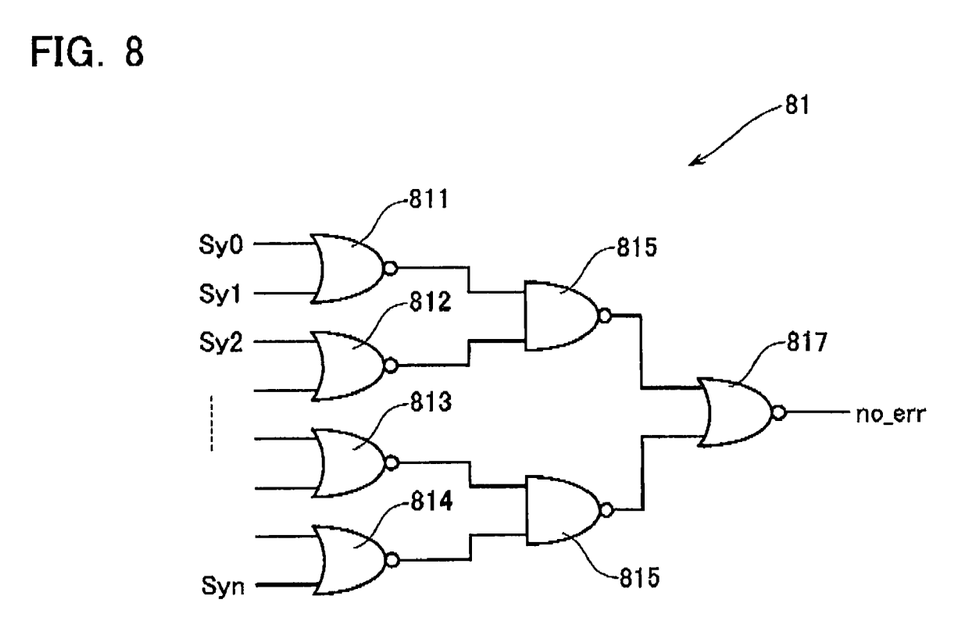
FIG. 8 is a circuit diagram illustrating an example configuration of the determination circuit 81 included in the control circuit 8.

In addition, the control circuit 8 includes a determination circuit 81 to determine whether an error exists in data that is read from one of the columns to be read based on syndromes Sy (Sy0, Sy1, . . . , Syn). FIG. 8 illustrates an example configuration of the determination circuit 81. The circuit 81 comprises NOR gates 811 to 814, NAND gates 815 and 816, and a NOR gate 817.

Any two of the syndrome values Sy0 to Syn are input to each of the NOR gates 811 to 814, which in turn outputs NOR of the two syndrome values. The NAND gates 815 and 816 then outputs NAND of the two output signals provides by the NOR gates 811 to 814.

The NOR gate 817 outputs NOR of the outputs provided by the NAND gates 815 and 816. With this configuration, the determination circuit 81 only sets an output signal no_err to "H" when all of the syndrome values Sy0 to n are "L", i.e., when the read data has no error.

Figure 9:
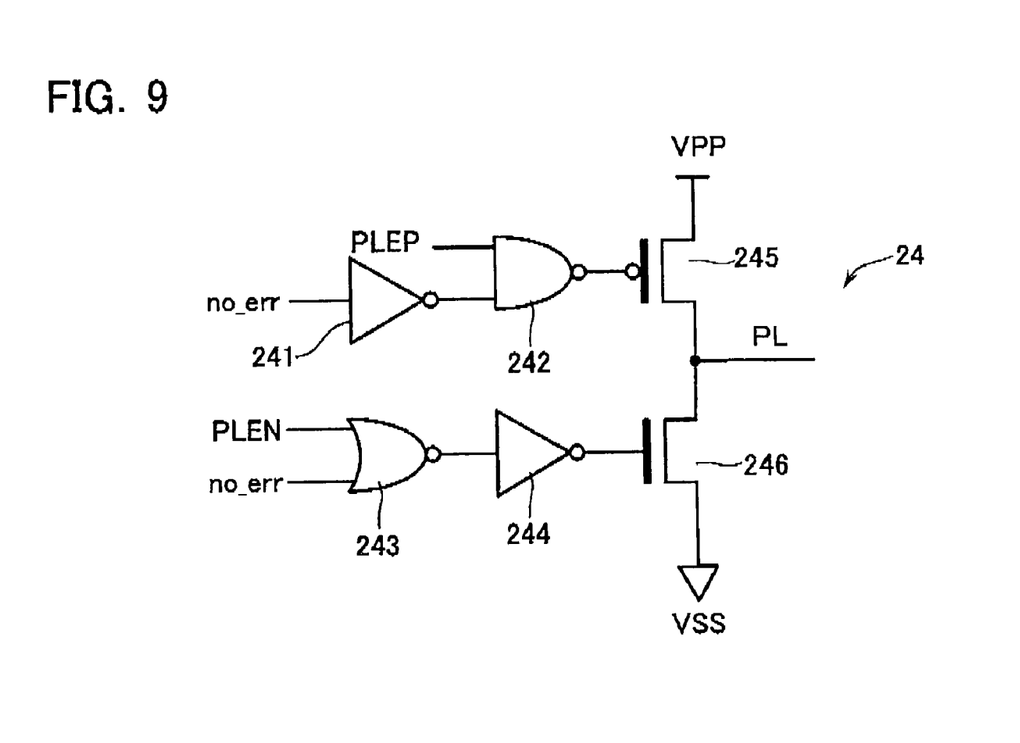
FIG. 9 is a diagram illustrating an example configuration of the plate line control circuit 24.
Figure 10:
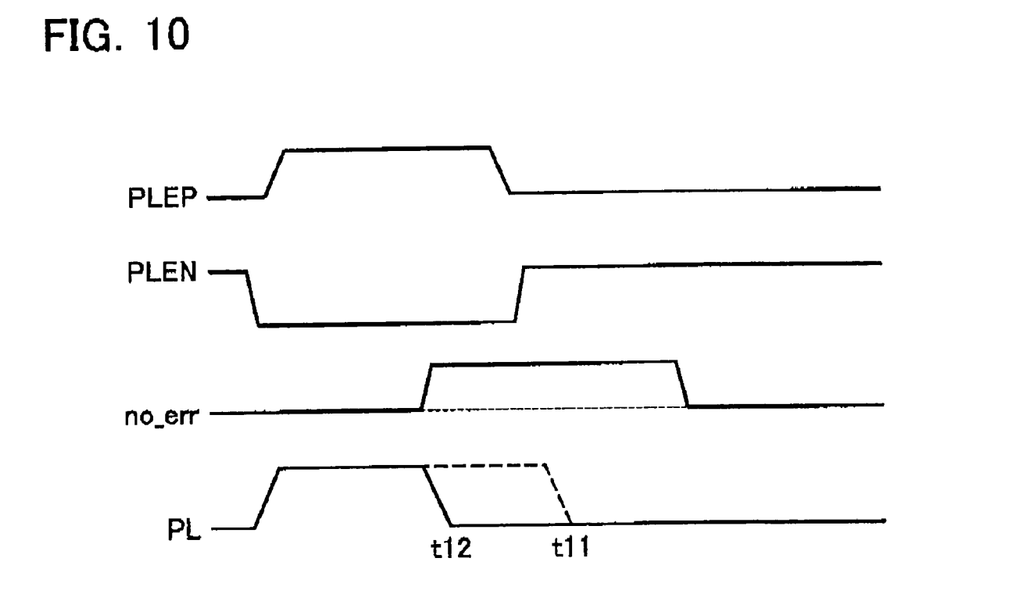
FIG. 10 is a timing chart illustrating the operation of the first embodiment.

FIG. 9 illustrates an example configuration of the plate line control circuit 24 described above. In addition, FIG. 10 is a timing chart illustrating the operation of the plate line control circuit 24.

In this case, the plate line control circuit 24 comprises an inverter 241, a NAND gate 242, a NOR gate 243, an inverter 244, a PMOS transistor 245, and an NMOS transistor 246. The inverter 241 outputs an inverted version of the above-mentioned output signal no_err.

The NAND gate 242 outputs the output signal provided by the inverter 241 and a plate-line drive signal PLEP. The plate-line drive signal PLEP is set to "H" when a plate line voltage applied to the plate line PL is rising, while it is set to "L" when the plate line voltage is falling. Meanwhile, a plate-line drive signal PLEN is set to "L" when the plate line voltage is rising, while it is set to "H" when the plate line voltage is falling.

The NOR gate 243 outputs NOR of the plate-line drive signal PLEN and the output signal no_err. The inverter 244 outputs an inverted version of the output signal provided by the NOR gate 243.

The PMOS transistor 245 and the NMOS transistor 246 are connected in series between a plate line voltage Vpp and a ground potential Vss. In addition, output signals from the NAND gate 242 and the inverter 244 are applied to the gates of the PMOS transistor 245 and the NMOS transistor 246, respectively.

As illustrated in FIG. 10, when the plate-line drive signal PLEP changes from "L" to "H" while at the same time the plate-line drive signal PLEN changes from "H" to "L", voltage of the plate line PL switches from the ground potential Vss to a power supply voltage Vpp.

If it is determined that an error exists in the read data, then the output signal no_err output from the determination circuit 81 remains "L" (as indicated by the dotted line of FIG. 10). Accordingly, the voltage of the plate line PL is kept at the power supply voltage Vpp until time t11, necessary timing for error correction.

Alternatively, if it is determined that no error exists in the read data, then the output signal no_err output from the determination circuit 81 becomes "H" (as indicated by the dotted line of FIG. 10). Thus, the voltage of the plate line PL falls to the ground potential Vss at time t12 preceding time t11. This achieves the operations described with respect to FIGS. 1 through 3 as well as the advantages mentioned above.

Second Embodiment

Figure 11:
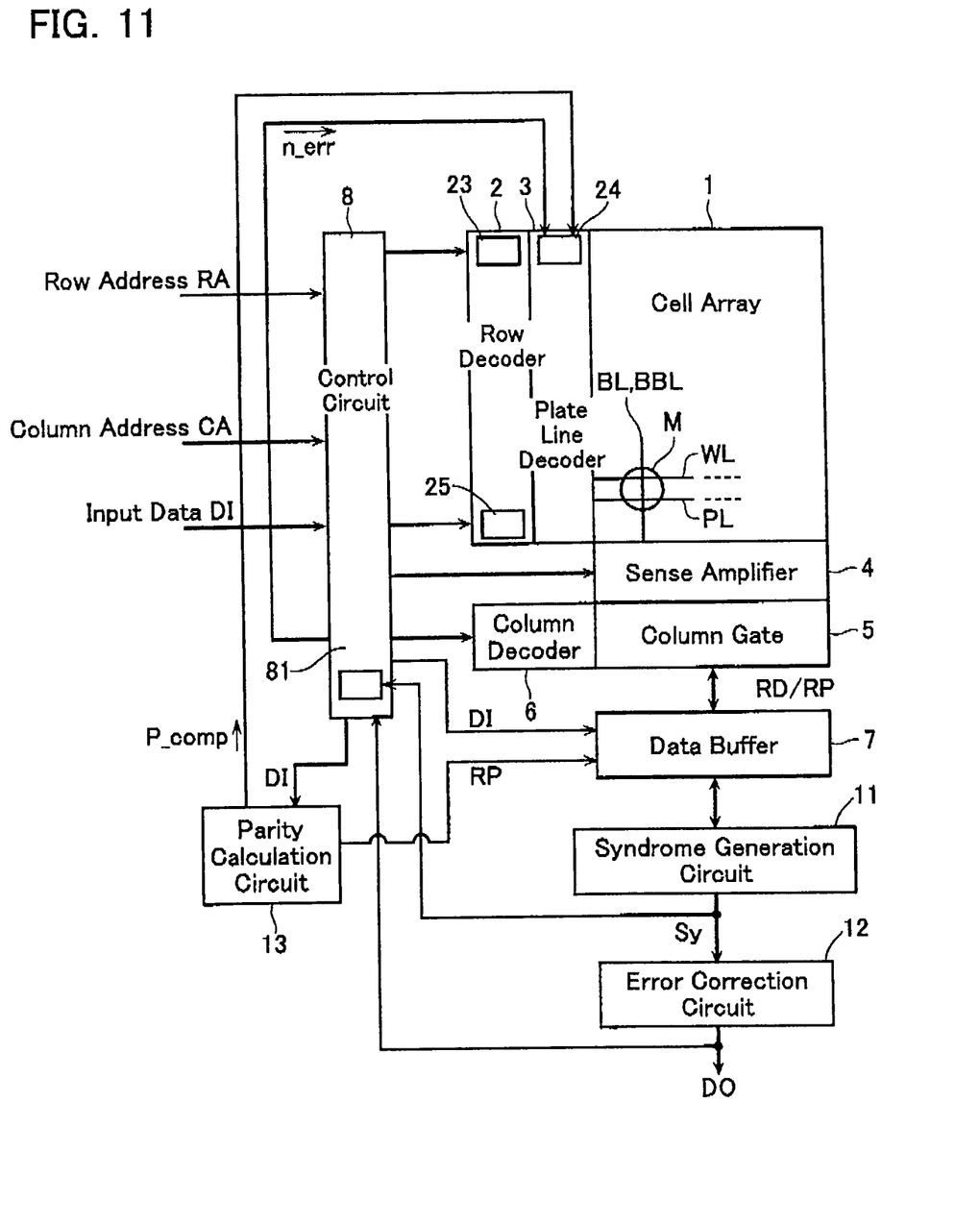
FIG. 11 is a circuit diagram illustrating an entire configuration of a ferroelectric memory according to a second embodiment of the present invention.

Referring now to FIG. 11, a ferroelectric memory according to a second embodiment of the present invention will be described below. FIG. 11 is a block diagram illustrating an entire configuration of the ferroelectric memory of this embodiment. The same reference numerals represent the same components as the first embodiment (FIG. 6) and description thereof will be omitted.

In this embodiment, the ferroelectric memory comprises a parity data calculation circuit 13 that generates parity data RP based on input data DI input from the outside as written data. The generated parity data RP is input to the data buffer 7 together with the input data DI, provided via the column gate 5 to the sense amplifier 4, and then written to the memory cell array 1. In this embodiment, it is assumed that the size of data to be written at a time when writing is the same as that of read data to be corrected and output at a time by the error correction circuit 12.

In this embodiment, the parity data calculation circuit 13 is configured to output a signal P_comp that indicates the generated parity data RP is reflected in the bit lines BL and BBL. The signal P_comp is output to a plate line control circuit 24A. As with the plate line control circuit 24 of the first embodiment, the plate line control circuit 24A operates to switch the timing in reading data when the potential of the plate line PL falls depending on absence or presence of error correction. However, the plate line control circuit 24A is different from the plate line control circuit 24 in its operation when writing data.

That is, when writing data, the plate line control circuit 24A is configured to cause the potential of the plate line PL to drop according to the signal P_comp mentioned above, irrespective of an output signal n_err provided by a determination circuit 81A. As can be seen from the above, with the ferroelectric memory of this embodiment, the size of data to be written at a time when writing becomes the same as that of read data to be corrected and output at a time by the error correction circuit 12. In this case, even if some incorrect data has been written to one of the memory cells for writing, such data is overwritten with new data DI. Therefore, in this embodiment, the potential of the plate line PL is allowed to fall to the ground potential Vss at a timing earlier than that in reading operation as soon as parity data RP is generated and transferred to the corresponding bit line, irrespective of the determination of the syndrome generation circuit 11 as well as the determination circuit 81. This may allow the potential of the plate line PL to fall to the ground potential Vss earlier, prevent any imprint, and improve the reliability of cell data.

Figure 12:
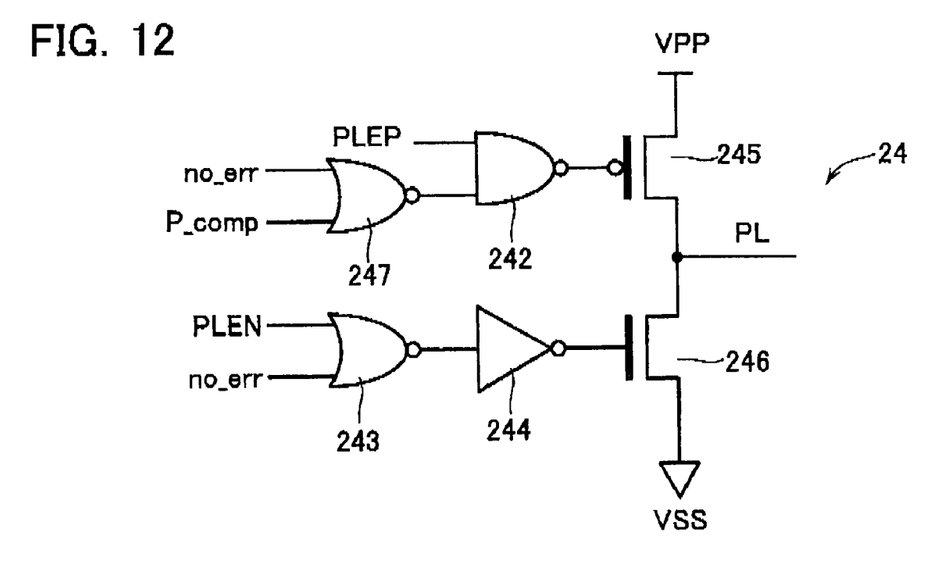
FIG. 12 is a diagram illustrating an example configuration of the plate line control circuit 24.
Figure 13:
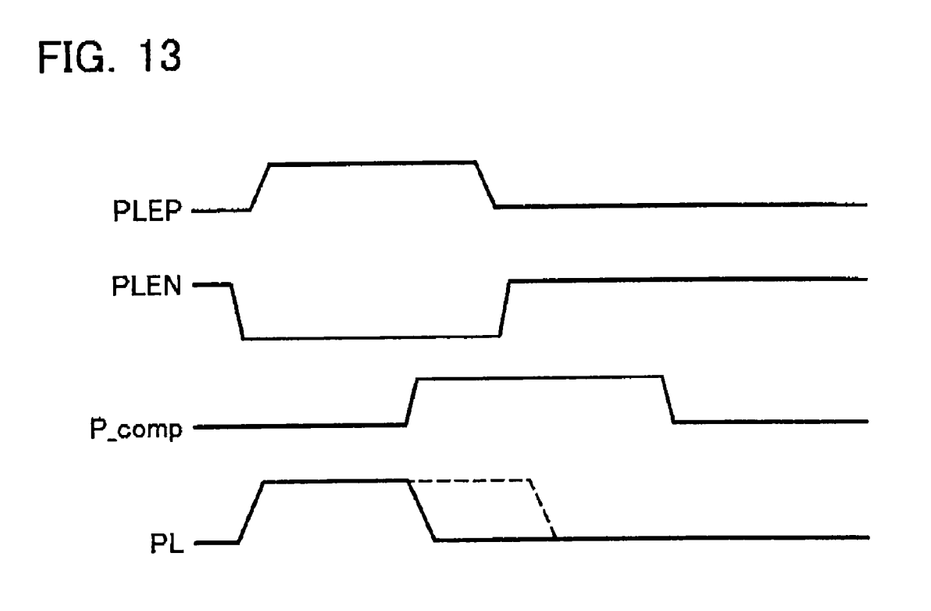
FIG. 13 is a timing chart illustrating the operation of the second embodiment.

Turning to FIG. 12, an example configuration of the plate line control circuit 24A according to this embodiment will be described below. The plate line control circuit 24A is different from the plate line control circuit 24 in that it comprises a NOR gate 247 that is provided with signals no_err and P_comp as input signals, instead of the inverter 241. The output terminal of the NOR gate 247 is provided to the NAND gate 242. This configuration allows voltage of the plate line PL to fall to Vss earlier when the signal P_comp becomes "H" upon completion of generation of parity data RP, and so on (see FIG. 13).

Note that the writing data operation is similar to that described in the first embodiment.

Third Embodiment

Figure 14:
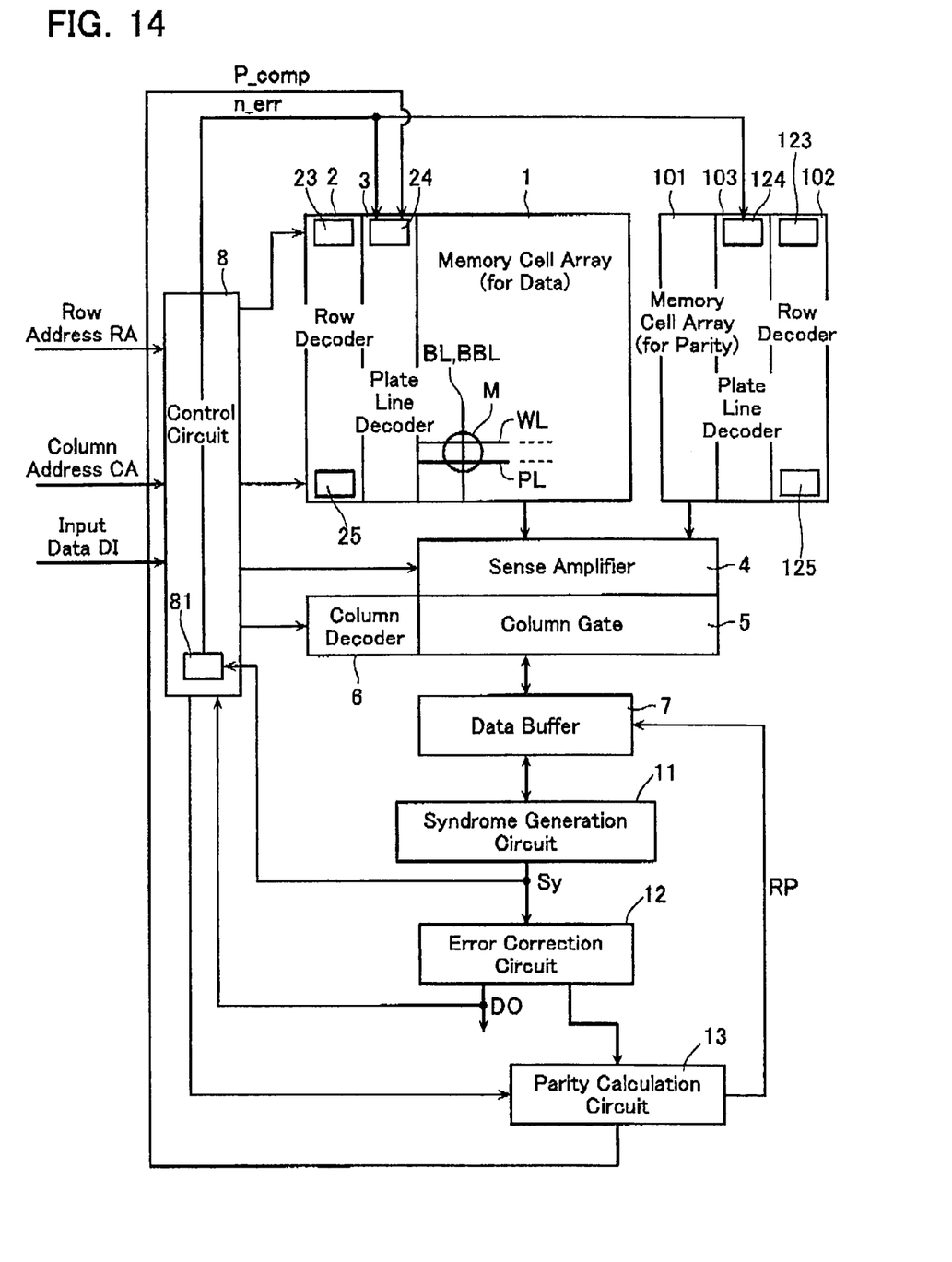
FIG. 14 is a circuit diagram illustrating an entire configuration of a ferroelectric memory according to a third embodiment of the present invention.

Referring now to FIG. 14, a ferroelectric memory according to a third embodiment of the present invention will be described below. FIG. 14 is a block diagram illustrating an entire configuration of the ferroelectric memory of this embodiment. The same reference numerals represent the same components as the first embodiment (FIG. 11) and description thereof will be omitted.

This embodiment is different from the aforementioned embodiments in that separate memory cell arrays are provided: a memory cell array 1 (for data) for storing effective data and a memory cell array 101 (for parity) for storing parity data as an error correction code, Correspondingly, a row decoder 102 and a plate line decoder 103 are provided separately from the row decoder 2 and the plate line decoder 3. Note that this embodiment assumes a scenario in which the size of data to be written at a time when writing is different from that of read data to be corrected and output at a time by the error correction circuit 12.

In this case, reading and writing operations with respect to the memory cell array 1 for storing effective data may be performed as described in the second embodiment. That is, in reading operation, the potential of the plate line PL is caused to early fall if error correction is not required; while in writing operation, the potential of the plate line PL is caused to early fall upon completion of generation of the parity data and preparation of writing operation. The reading operation may also be performed with respect to the memory cell array 101 for the parity data as described in the second embodiment.

On the other hand, the writing operation is different from that described in the second embodiment with respect to the memory cell array 101 for the parity data. That is, a plate line control circuit 124 is only controlled by the write-enable signal WE without affected by a signal no_err or P_comp. This is because, as described above, the size of data to be written at a time when writing is different from that of read data to be corrected and output at a time by the error correction circuit 12.

Fourth Embodiment

Figure 15:
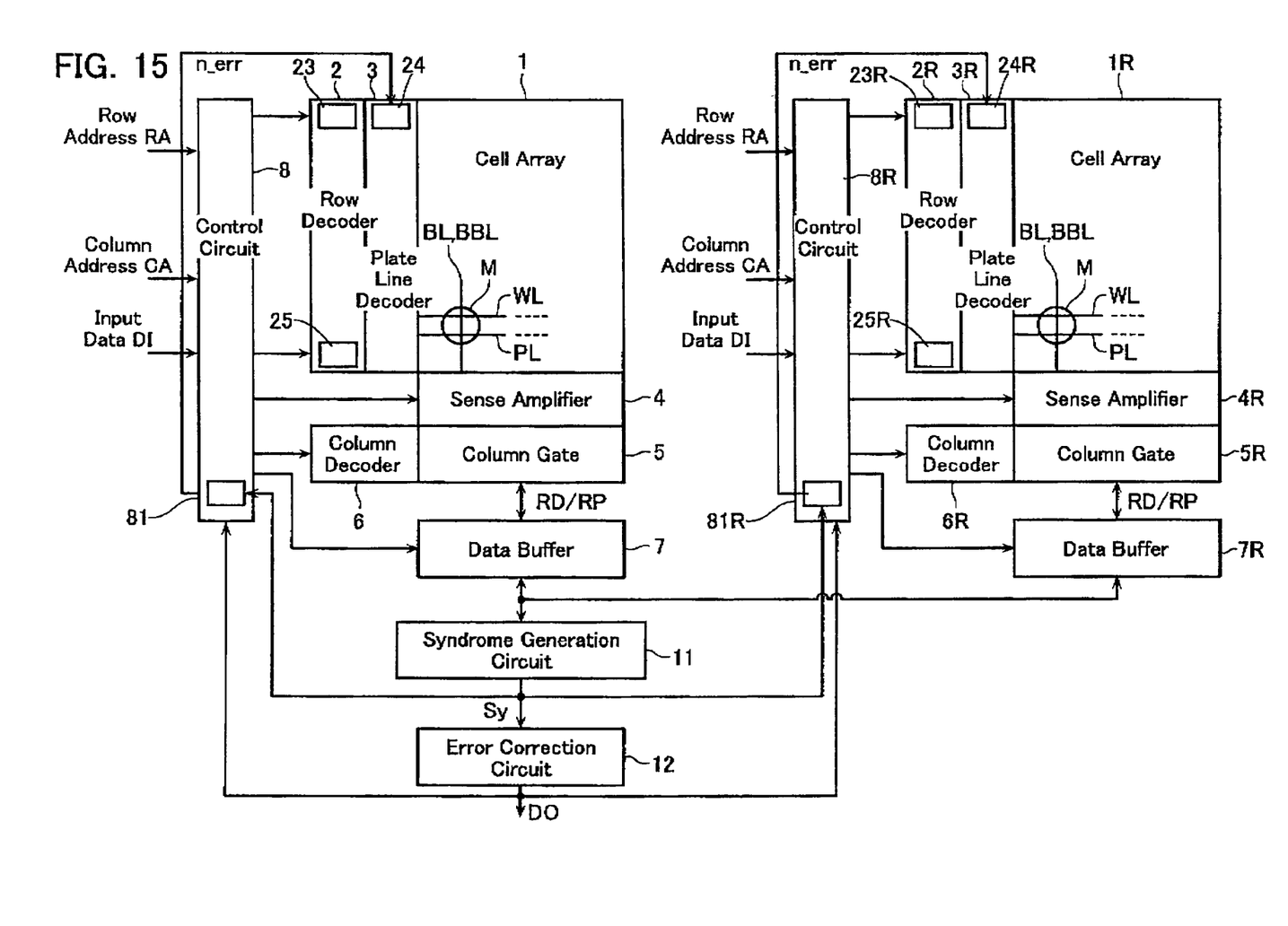
FIG. 15 is a circuit diagram illustrating an entire configuration of a ferroelectric memory according to a fourth embodiment of the present invention.

Referring now to FIG. 15, a ferroelectric memory according to a fourth embodiment of the present invention will be described below. FIG. 15 is a block diagram illustrating an entire configuration of the ferroelectric memory of this embodiment. The same reference numerals represent the same components as the first embodiment (FIG. 6) and description thereof will be omitted.

This embodiment illustrates a case where a memory cell array 1R is also formed in addition to a memory cell array 1 that is formed by a plurality of memory mats and data is read from the plurality of memory mats. The memory cell array 1R shares the syndrome generation circuit 11 and the error correction circuit 12 with the memory cell array 1, but it also has some other independent components. Note that the corresponding components are indicated by additional labels "R" in FIG. 15.

With this configuration, independent control of potential of a plate line may be achieved for each of the memory mats. For example, it is assumed that an error is detected in the memory cell array 1, while no error is detected in the memory cell array 1R. In this case, at the plate line control circuit 24R provided in the memory cell array 1R, the potential of the plate line PL is caused to early fall, while at the plate line control circuit 24, the potential of the plate line PL is kept in "H" for a long period of time for error correction. According to this scheme, the potential of a plate line may be optimized for each memory mat, achieving improved data reliability.

Although embodiments of the present invention have been described above, the present invention is not intended to be limited to the disclosed embodiments and various changes, additions, replacements, deletions or the like may be made thereto without departing from the scope of the invention.

What is claimed is:

1. A semiconductor storage device comprising:
a memory cell array having memory cells arranged therein, each of the memory cells having a ferroelectric capacitor and a selection transistor;
a plate line applying a certain plate line voltage to one end of the ferroelectric capacitor;
a bit line configured to read a signal from the memory cell;
a sense amplifier circuit sensing and amplifying voltage of the bit line;
an error correction circuit detecting and correcting any error in retained data in the memory cells sensed by the sense amplifier; and
a control circuit controlling the timing for switching a potential of the plate line from a first potential to a second potential lower than the first potential, based on absence or presence of error correction by the error correction circuit.

2. The semiconductor storage device according to claim 1, wherein
when no error is detected by the error correction circuit, the control circuit switches a potential of the plate line from the first potential to the second potential at an earlier timing than when an error is detected.

3. The semiconductor storage device according to claim 2, wherein
the control circuit controls the timing so that the length of time for rewriting the memory cell in which first data is stored is substantially the same as that for rewriting the memory cell in which second data is stored.

4. The semiconductor storage device according to claim 1, further comprising:
a syndrome generation circuit generating a syndrome based on retained data in the memory cell sensed by the sense amplifier and an error correction code,
wherein the control circuit is configured to control a potential of the plate line based on the syndrome.

5. The semiconductor storage device according to claim 4, wherein
when no error is detected by the error correction circuit, the control circuit switches a potential of the plate line from the first potential to the second potential at an earlier timing than when an error is detected.

6. The semiconductor storage device according to claim 5, wherein
the control circuit controls the timing so that the length of time for rewriting the memory cell in which first data is stored is substantially the same as that for rewriting the memory cell in which second data is stored.

7. The semiconductor storage device according to claim 1, wherein
the control circuit comprising:
a PMOS transistor with a source supplied with the first potential;
an NMOS transistor with a drain connected to the drain of the PMOS transistor and a source supplied with a second potential;
a first logic gate circuit controlling the gate of the PMOS transistor; and
a second logic gate circuit controlling the gate of the NMOS transistor.

8. The semiconductor storage device according to claim 7, wherein
when no error is detected by the error correction circuit, the control circuit switches a potential of the plate line from the first potential to the second potential at an earlier timing than when an error is detected.

9. The semiconductor storage device according to claim 8, wherein
the control circuit controls the timing so that the length of time for rewriting the memory cell in which first data is stored is substantially the same as that for rewriting the memory cell in which second data is stored.

10. The semiconductor storage device according to claim 7, further comprising:
a syndrome generation circuit generating a syndrome based on retained data in the memory cell sensed by the sense amplifier and an error correction code,
wherein the control circuit is configured to control a potential of the plate line based on the syndrome.

11. The semiconductor storage device according to claim 1, further comprising:
a parity calculation circuit generating parity data based on external data to be written to the memory cell array,
wherein the control circuit is configured to control the timing for switching a potential of the plate line based on a signal indicating the parity data is generated.

12. The semiconductor storage device according to claim 11, wherein when no error is detected by the error correction circuit, the control circuit switches a potential of the plate line from the first potential to the second potential at an earlier timing than when an error is detected.

13. The semiconductor storage device according to claim 12, wherein
the control circuit controls the timing so that the length of time for rewriting the memory cell in which first data is stored is substantially the same as that for rewriting to the memory cell in which second data is stored.

14. The semiconductor storage device according to claim 11, wherein
the control circuit comprising:
a PMOS transistor with a source supplied with the first potential;
an NMOS transistor with a drain connected to the drain of the PMOS transistor and a source supplied with a second potential;
a first logic gate circuit controlling the gate of the PMOS transistor; and
a second logic gate circuit controlling the gate of the NMOS transistor.

15. The semiconductor storage device according to claim 1, wherein
the memory cell array is configured by a plurality of memory mats, and
the control circuit controls a potential of the plate line independently for each of the memory mats.

16. The semiconductor storage device according to claim 15, wherein
when no error is detected by the error correction circuit, the control circuit switches a potential of the plate line from the first potential to the second potential at an earlier timing than when an error is detected.

17. The semiconductor storage device according to claim 16, wherein
the control circuit controls the timing so that the length of time for rewriting the memory cell in which first data is stored is substantially the same as that for rewriting the memory cell in which second data is stored.

* * * * *